(12) United States Patent
Bobde et al.

(10) Patent No.: US 8,324,053 B2
(45) Date of Patent: Dec. 4, 2012

(54) HIGH VOLTAGE MOSFET DIODE REVERSE RECOVERY BY MINIMIZING P-BODY CHARGES

(75) Inventors: Madhur Bobde, San Jose, CA (US);
Lingpeng Guan, Santa Clara, CA (US);
Anup Bhalla, Santa Clara, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 451 days.

(21) Appl. No.: 12/587,054

(22) Filed: Sep. 30, 2009

(65) Prior Publication Data
US 2011/0073906 A1    Mar. 31, 2011

(51) Int. Cl.
*H01L 29/739* (2006.01)
*H01L 29/78* (2006.01)
*H01L 21/336* (2006.01)
*H01L 21/331* (2006.01)

(52) U.S. Cl. .................. 438/268; 257/328; 257/329
(58) Field of Classification Search .............. 257/328, 257/329; 438/268
See application file for complete search history.

(56) References Cited

U.S. PATENT DOCUMENTS
2008/0128798 A1* 6/2008 Schulze et al. .............. 257/328
* cited by examiner

*Primary Examiner* — Wai Sing Louie
*Assistant Examiner* — Robert Carpenter
(74) *Attorney, Agent, or Firm* — Bo-In Lin

(57) ABSTRACT

This invention discloses a method for manufacturing a semiconductor power device in a semiconductor substrate comprises an active cell area and a termination area. The method comprises the steps of a) growing and patterning a field oxide layer in the termination area and also in the active cell area on a top surface of the semiconductor substrate b) depositing and patterning a polysilicon layer on the top surface of the semiconductor substrate at a gap distance away from the field oxide layer; c) performing a blank body dopant implant to form body dopant regions in the semiconductor substrate substantially aligned with the gap area followed by diffusing the body dopant regions into body regions in the semiconductor substrate; d) implanting high concentration body-dopant regions encompassed in and having a higher dopant concentration than the body regions e) applying a source mask to implant source regions having a conductivity opposite to the body region with the source regions encompassed in the body regions and surrounded by the high concentration body-dopant regions; and f) etching contact trenches into the source, body contact, and body regions.

12 Claims, 20 Drawing Sheets

US 8,324,053 B2

HIGH VOLTAGE MOSFET DIODE REVERSE RECOVERY BY MINIMIZING P-BODY CHARGES

BACKGROUND OF THE INVENTION

1. Field of the Invention

The invention relates generally to the configurations and methods of manufacturing semiconductor power devices. More particularly, this invention relates to a device configuration and method of manufacturing semiconductor power devices integrated with Schottky diode without requiring additional masks, for reducing the turn off time and the power losses.

2. Description of the Prior Art

There is a great demand for implementing a semiconductor power device by integrating the Schottky diode as an internal diode. Specifically, the high voltage metal oxide semiconductor field effect transistor (HV MOSFET) behaves like a P-i-N diode with a negative drain-to-source voltage Vds<0, due to the built-in body diode formed by the P+, P− Body, and N-epi as shown in FIG. 1A. A high level injection into the N− Epi region from the P-body regions causes a large turn off time and losses. Furthermore, a high rate of current variation, i.e., a large di/dt, causes a voltage spike and reduces a "softness factor" S. However, in order to improve the performance of the HV MOSFET, there is a need to reduce the turn off time and losses, i.e., to reduce the reverse recovery charge (Qrr), recovery time (Trr), and to increase the softness factor S. A HV MOSFET when integrated with an internal Schottky diode improves the performance of the HV MOSFET by resolving these technical limitations.

In addition to the above-mentioned demand for implementing the semiconductor power device with an integrated Schottky diode, the semiconductor power devices are widely implemented in a power supply and motor control applications. The semiconductor power devices are often formed with a full bridge type of topology as shown in FIG. 1B. For this type of application, an internal diode is very advantageous to function as a free-wheeling diode. A high voltage MOSFET, a super-junction semiconductor power device, and IGBT devices when implemented for the power supply and motor control applications often suffer from the limitations of high Qrr and power loss. A semiconductor power device when integrating the Schottky diode as an internal diode can resolve these technical problems. However, conventional configurations and methods of manufacturing the semiconductor power devices usually require an additional mask to block an area in order to integrate the Schottky diode as an internal diode of the power device in that area. Production costs are adversely affected due to additional this mask requirement.

For all these reasons, there are great and urgent demands to improve the configurations and method of manufacturing the semiconductor power device to integrate with the Schottky diodes as an internal diode and to improve the Qrr, Trr and S such that the above-discussed technical limitations and difficulties can be resolved.

SUMMARY OF THE PRESENT INVENTION

It is therefore an aspect of the present invention to provide a new and improved method and device configuration to manufacture a semiconductor power device to integrate with a Schottky diode without requiring an additional mask.

Specifically, it is an aspect of the present invention to provide improved device configuration and method for manufacturing a semiconductor power device to integrate with Schottky diodes without additional mask while significantly reducing the Qrr, Trr and increasing the softness factor S.

It is another aspect of the present invention to provide improved device configuration and method for manufacturing a semiconductor power device to integrate with Schottky diodes by reducing the distance between the edge of the planar gates to the field oxide to form the self-aligned body regions and to covering the top surfaces over the source and body regions with a Schottky metal to function as a source and emitter metal to integrate the Schottky diode directly as part of the transistor cells without increasing the cell pitch such that significantly reduces the Qrr by about 50%, Trr by 20% and increases the softness factor S by about 33%.

It is another aspect of the present invention to provide improved device configuration and method for manufacturing a semiconductor power device with reduced amounts of body-type charges available for high level injection to reduce the Qrr, Trr and increasing the softness factor S.

Briefly in a preferred embodiment this invention discloses a semiconductor power device disposed in a semiconductor substrate. The semiconductor power device comprises an active cell area and a termination area. The semiconductor power device further comprises a gate comprises a patterned polysilicon layer disposed on a top surface of the semiconductor substrate. The semiconductor power device further comprises a patterned field oxide layer disposed in the termination area and also in the active cell area at a gap area away from the patterned polysilicon layer on the top surface of the semiconductor substrate. The semiconductor power device further comprises doped body regions disposed in the semiconductor substrate substantially diffused from a region aligned with the gap area below the top surface and extended to regions below the patterned polysilicon layer and the patterned field oxide layer. The semiconductor power device further comprises doped source regions encompassed in and having an opposite conductivity type from the body regions. The semiconductor power device further comprises high concentration body-dopant regions encompassed in and having a higher dopant concentration than the body region surrounding the source regions. In another embodiment, the semiconductor power device further comprises a patterned Schottky metal layer covering an area previously occupied by the field oxide layer in the active cell area and subsequently removed from on the top surface of the semiconductor substrate wherein the patterned Schottky metal layer further extends partially into the gap areas for contacting the body regions and the source regions to form integrated Schottky diodes for the semiconductor power device in the active cell area. In another embodiment, the semiconductor power device further comprises shallow body-dopant implantations disposed adjacent to the body regions immediately under the Schottky metal layer. In another embodiment a contact trench is etched into the semiconductor substrate to allow lateral contact to the source and body contact regions and to reduce the amount of P body charges available for high level injections. In another embodiment, the semiconductor substrate comprises a N-type epitaxial layer for supporting the body-dopant regions of P-type conductivity encompassing the source regions of N-type conductivity therein. In another embodiment, the semiconductor substrate comprises a P-type epitaxial layer for supporting the body-dopant regions of N-type conductivity encompassing the source regions of P-type conductivity therein. In another embodiment, the semiconductor power device further comprises a MOSFET power device. In another embodiment, the semiconductor power device further comprises a N-channel MOSFET power device supported on a N-type semiconductor substrate. In another embodiment, the semiconductor power device further comprises a P-channel MOSFET power device supported on a P-type semiconductor substrate. In another embodiment, the semiconductor power device further comprises an insulated gate bipolar transistor (IGBT) power device. In another embodiment, the semiconductor power device further comprises an insulated gate bipolar transistor (IGBT) power device supported on a N-type epitaxial layer including a P-type bottom layer with N-type dopant regions disposed near a bottom surface of the semiconductor substrate. In another embodiment, the semiconductor power device further comprises a superjunction semiconductor power device comprises alternating charge balanced N-type and P-type dopant columns in the semiconductor substrate below the body-dopant regions. In another embodiment, the semiconductor power device further comprises a superjunction semiconductor power device disposed in a N-type semiconductor substrate comprises P-type columns underneath the body dopant regions doped with a P-type dopant and N-type columns between the P-type columns.

This invention further discloses a method for manufacturing a semiconductor power device in a semiconductor substrate comprises an active cell area and a termination area. The method comprises steps of A) growing and patterning a field oxide layer in the termination area and also in the active cell area on a top surface of the semiconductor substrate; B) depositing and patterning a polysilicon layer on the top surface of the semiconductor substrate at a gap distance away from the field oxide layer; and C) performing a blank body dopant implant to form body dopant regions in the semiconductor substrate substantially aligned with the gap area followed by diffusing the body dopant regions into body regions in the semiconductor substrate. In another embodiment, the method further includes a step of implanting high concentration body-dopant regions encompassed in and having a higher dopant concentration than the body regions and applying a source mask to implant source regions having a conductivity opposite to the body region with the source regions encompassed in the body regions and surrounded by the high concentration body-dopant regions. In another embodiment, the method further includes a step of depositing an insulation layer on top of the semiconductor power device and applying a contact mask to open contact openings and remove the field oxide and etch contact trenches in the semiconductor substrate; and depositing a metal layer filling in the contact openings to contact the body regions and the source regions. In another embodiment, the method further includes a step of depositing an insulation layer on top of the semiconductor power device and applying a contact mask to open contact openings and remove the field oxide; and implanting a shallow body-dopants adjacent to the body regions immediately below the contact trench. In another embodiment, the step of manufacturing the semiconductor power device further comprises a step of manufacturing a MOSFET power device. In another embodiment, the step of manufacturing the semiconductor power device further comprises a step of manufacturing an IGBT power device. In another embodiment, the step of manufacturing the semiconductor power device further comprises a step of manufacturing an IGBT power device in a N-type semiconductor substrate and implanting a P-type bottom layer with N-type dopant regions near a bottom surface of the semiconductor substrate. In another embodiment, the step of manufacturing the semiconductor power device further comprises a step of manufacturing a superjunction semiconductor power device by forming in the semiconductor substrate alternating N-type and P-type dopant columns in the semiconductor substrate below the body-dopant regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2-1 is a cross sectional view to show the termination structure of the high voltage MOSFET (HV MOSFET) semiconductor power device of this invention.

FIGS. 3A-1 to 3F-1 are a series of corresponding cross sectional views in termination area for each of the processing steps of FIGS. 3A to 3F.

FIG. 6D-1, an anneal process is carried out to diffuse the boron implanted regions to form multiple P-doped columns and FIG. 6D-2 shows a subsection of the figure from FIG. 6D-1 to show the remainder of the steps.

DETAILED DESCRIPTION OF THE METHOD

Figure 1A:
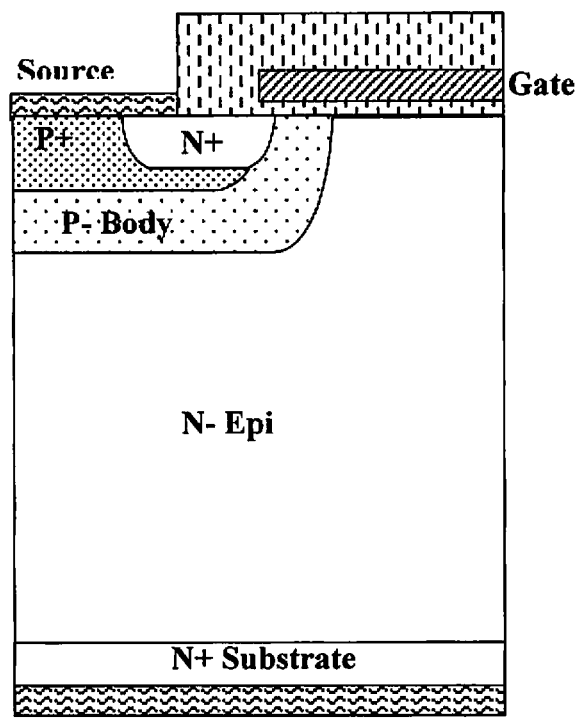
FIG. 1A is a cross sectional view for showing the conventional planar HV MOSFET devices without integrated Schottky diode.
Figure 1B:
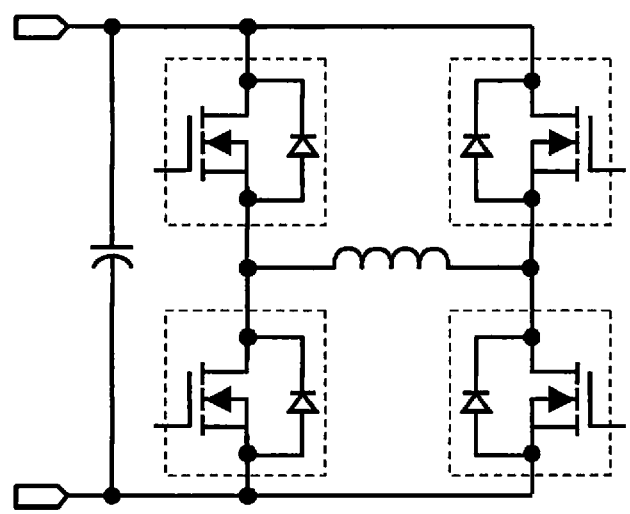
FIG. 1B shows a configuration of a full bridge circuit implemented in a power supply and motor control device
Figure 2:
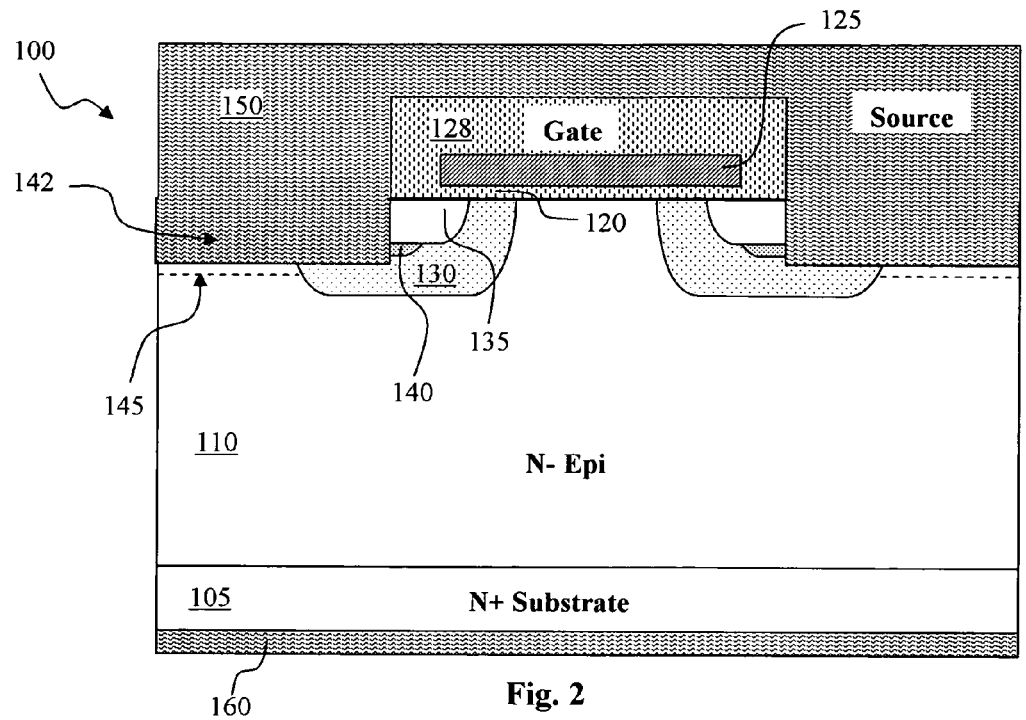
FIG. 2 is a cross sectional view of a HVMOSFET device with an integrated Schottky diode of this invention.
Figures 1, 2:
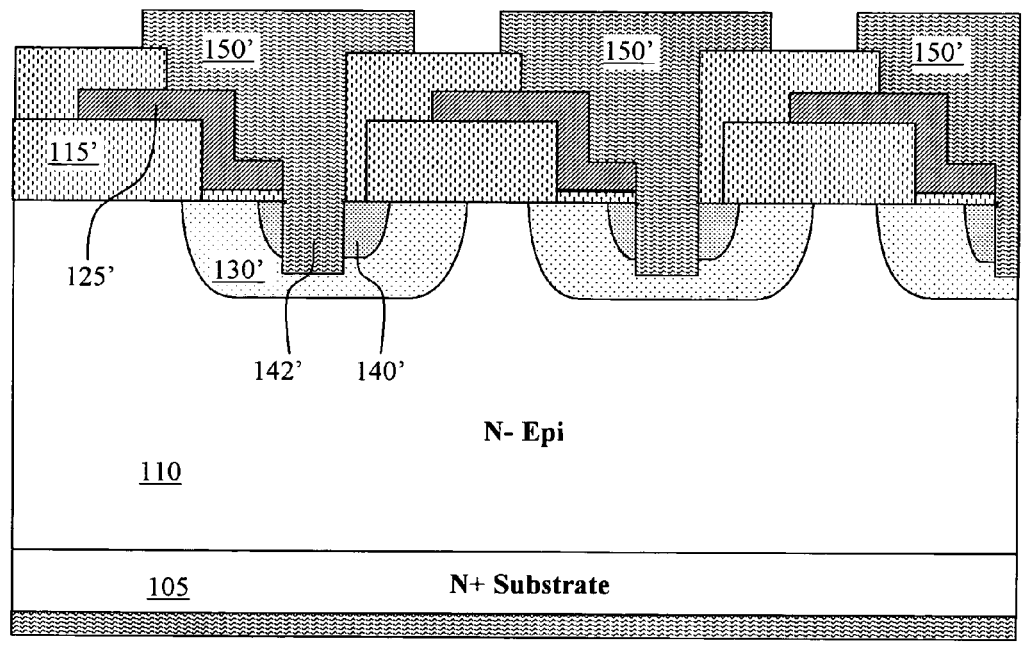

Referring to FIG. 2 for a cross sectional view of active cell 100 of a high voltage MOSFET (HV MOSFET) semiconductor power device of this invention. The HV MOSFET device is supported on an N+ silicon substrate 105 with an epitaxial layer 110 formed on top of the N+ substrate 105. A planar gate 125 is formed on top of a gate oxide layer 120. A P-body region 130 is formed in the epitaxial layer below the gate oxide layer 120 encompassing an N+ source region 135. The MOSFET device 100 further includes a P+ doped region 140 within the P-body region 130. A source metal 150 covering the top surface with direct contact to the source region 135 and the P-body region 130. A drain metal 160 to function as a drain electrode is formed on the back side of the semiconductor substrate 105 thus forming an active cell of vertical MOSFET power device. The drawing is not to scale, as the substrate 105 is typically several times thicker than the epitaxial layer 110. A contact trench 142 is formed to make side contact to the source region 135 and the P+ body contact region 140. The contact trench can help reduce the cell pitch of active cell 100, and also reduce the amount of body type charges available for high level injection. This improves the reverse recovery characteristics, Qrr, Trr, and S, while also improving the Rdson because of the smaller cell pitch. The MOSFET device may be integrated with an internal Schottky diode by applying a Schottky metal as the or under the source metal 150, contacting the source region 135, the P+ region 140 and the P-body region 130 and a Schottky region 145 adjacent to the P-body region 130. An ultra shallow P implantation layer 145 may be formed immediately underneath the Schottky metal 150 in the Schottky region to adjust the Schottky barrier height and reduce a leakage current. A high voltage MOSFET (HV MOSFET) semiconductor power device may include a plurality of active cells 100 connected in parallel to improve current handling capability. The high voltage MOSFET (HV MOSFET) semiconductor power device further includes a termination structure surrounding the active cells in the periphery area in order to withstand the voltage near the die edge. FIG. 2-1 shows the termination structure of the high voltage MOSFET (HV MOSFET) semiconductor power device that is integrated with a Schottky diode of this invention. The termination structure includes a plurality of field plates 125' electrically connected to floating guard rings 130' by metal conductor 150' through guard ring contact implants 140' and extending over field oxides 115' beyond the lateral boundary of guard ring 130'. Termination trenches 142' may be formed as a side-result of forming the contact trenches 142, but do not affect the operation of the termination structure.

Figure 3A:
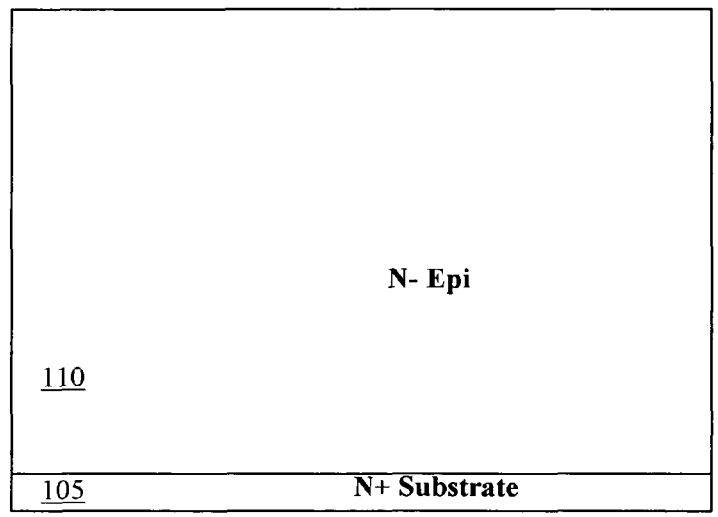
FIGS. 3A to 3F are a series of cross sectional views for showing the processing steps to manufacture a HV MOSFET device of this invention.
Figures 1, 3A:
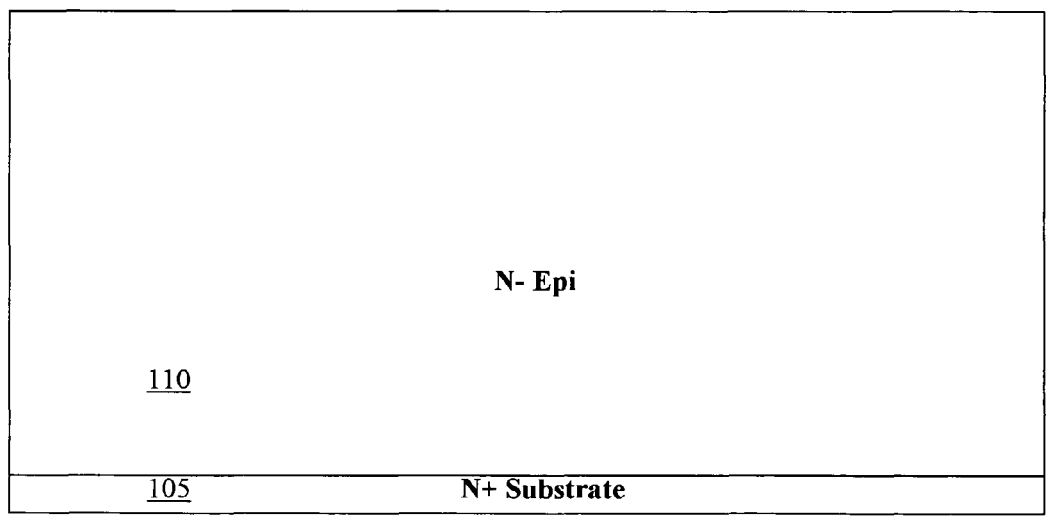
Figure 3B:
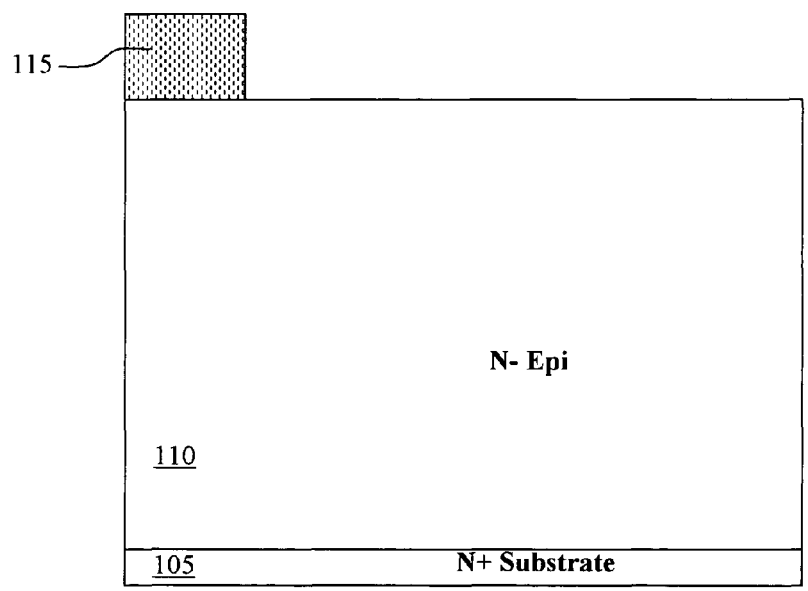
Figures 1, 3B:
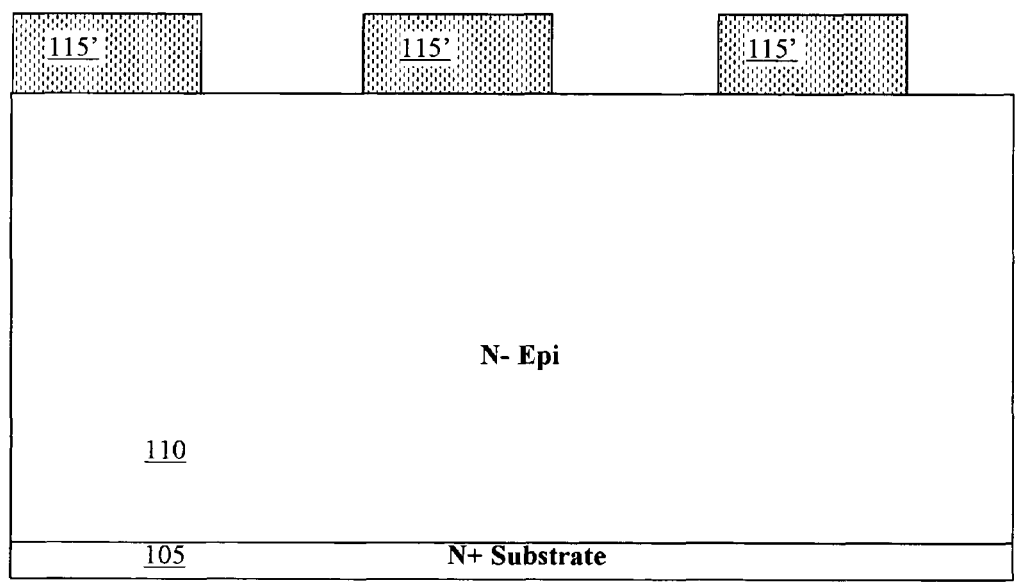
Figure 3C:
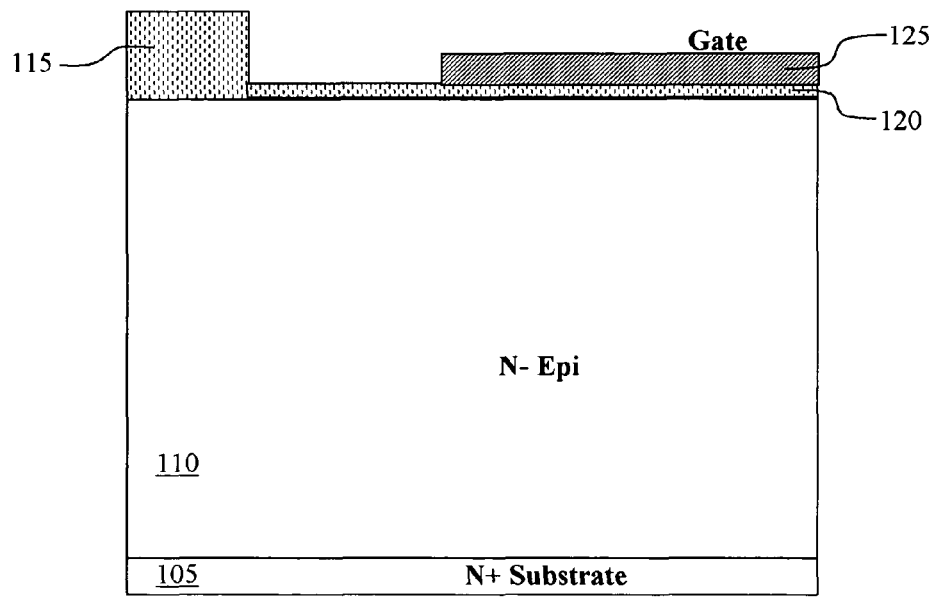
Figures 1, 3C:
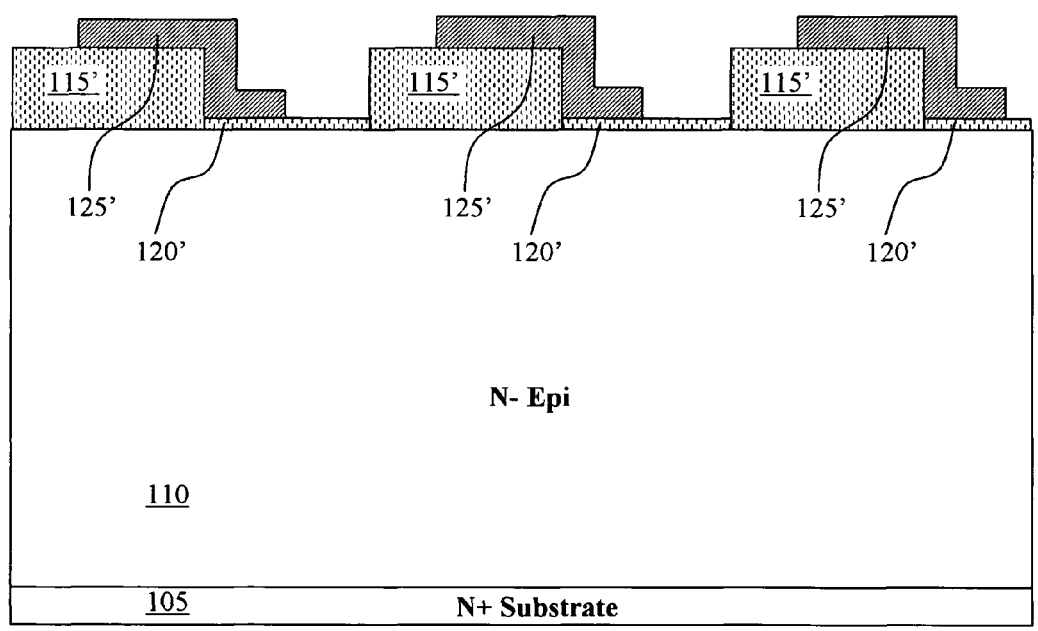
Figure 3D:
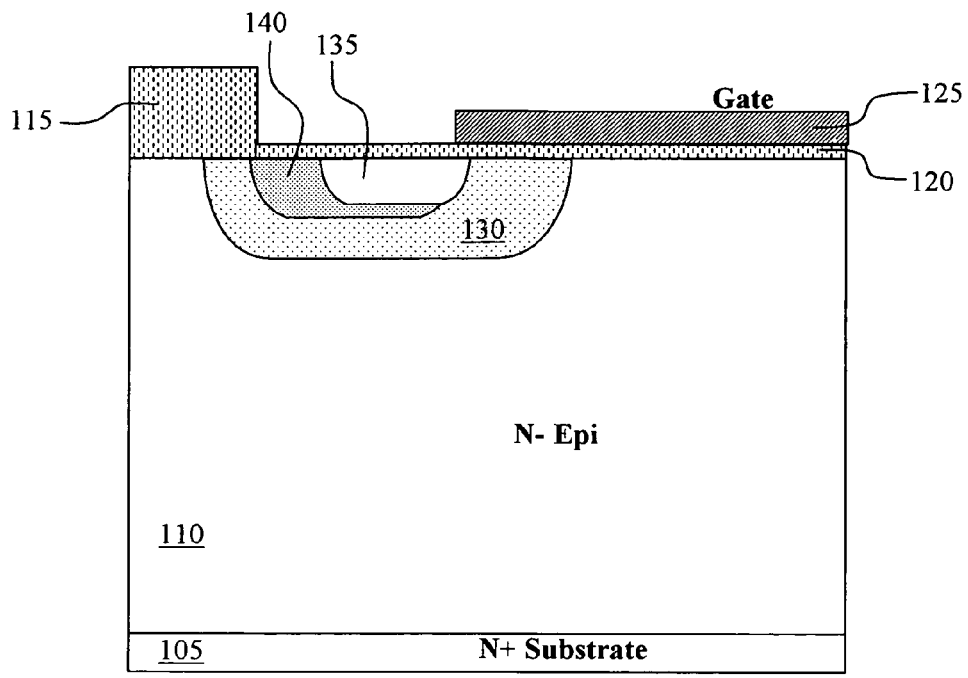
Figures 1, 3D:
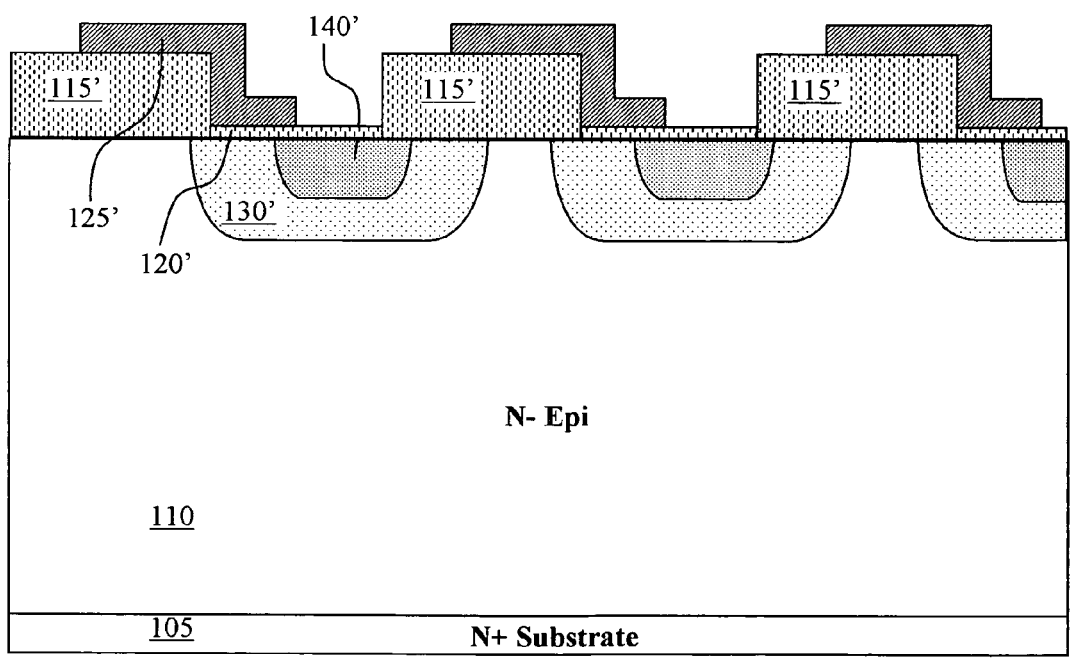
Figure 3E:
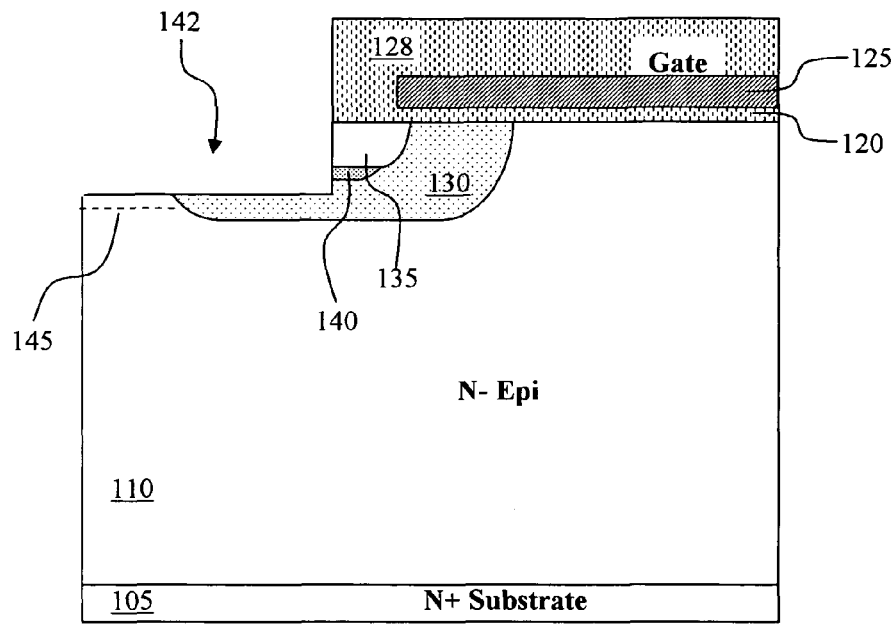
Figures 1, 3E:
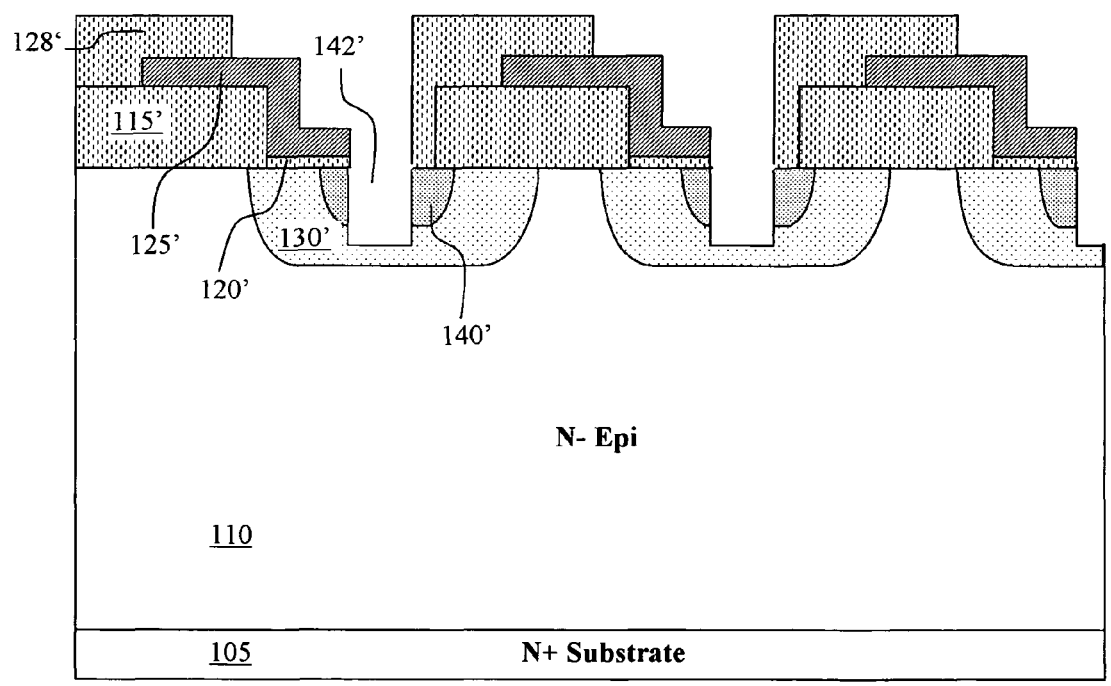
Figure 3F:
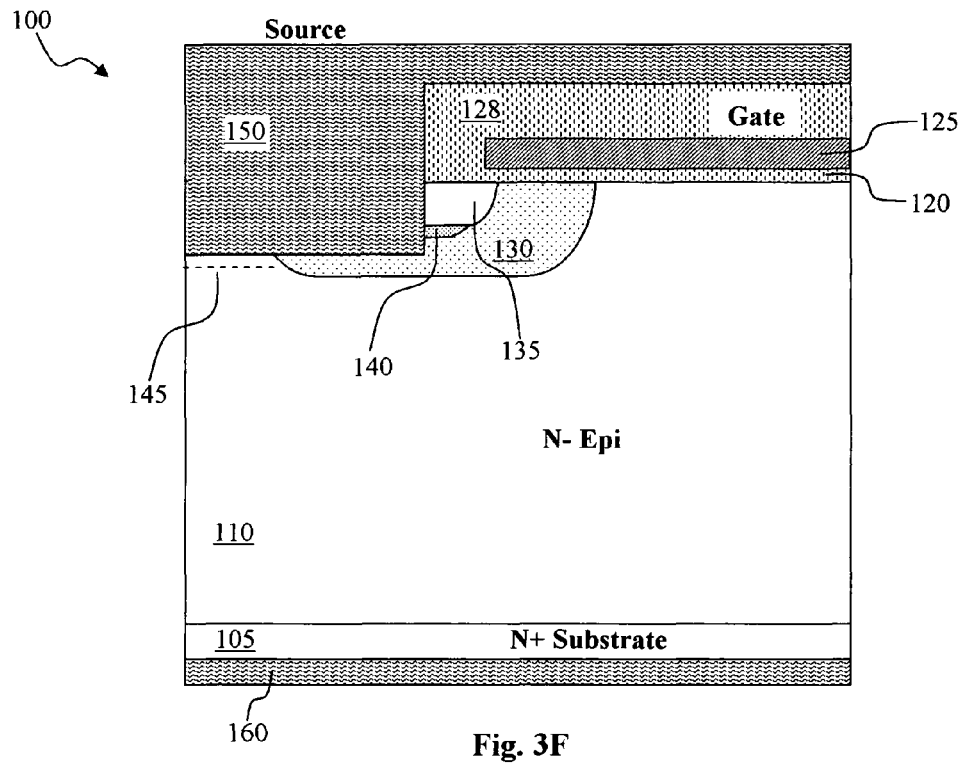
Figures 1, 3F:
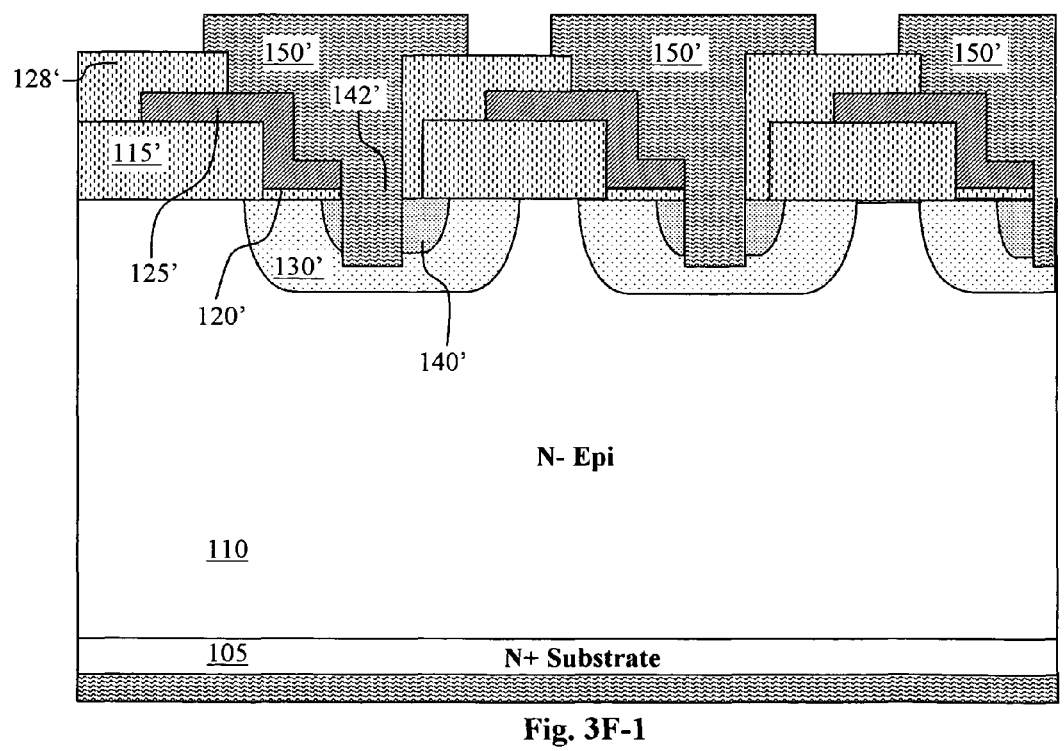

FIGS. 3A to 3F are a series of cross sectional views for illustrating the processing steps for manufacturing a high voltage MOSFET (HV-MOSFET) 100 shown in FIG. 2 and FIGS. 3A-1 to 3F-1 are the corresponding cross sectional views in termination area in each processing step for forming a termination area similar to the one shown in FIG. 2-1. A high voltage device requires termination structures in order to withstand the voltage near the die edge. In FIGS. 3A and 3A-1, the process starts with an N buffer doping substrate 105 supporting an N− epitaxial layer 110 with a layer thickness of about 50 to 75 micrometers grown thereon. In FIGS. 3B and 3B-1, a field oxide layer is grown and etched by applying a first mask (not shown) to form field oxide 115 in active area and 115' in termination area. In FIG. 3C, a gate oxide layer 120 is grown followed by depositing a polysilicon layer 125 on top of the gate oxide layer 120 and then patterning the polysilicon layer into the gate 125 by applying a second mask (not specifically shown). Thin oxide layer 120' and polysilicon structure 125' are formed in the same process in the termination area as shown in FIG. 3C-1. In FIG. 3D, a P-body dopant implant is carried out followed by a diffusion process to form the P-body region 130. A third mask (not shown) is applied to carry out an N+ source implant to form the source region 135. A P+ implant is also performed after the removal of source implant mask to form a P+ body contact region 140 below and possibly besides the N+ source region 135. The P-body dopant implant and the P+ implant use the existing field oxide and the gate poly 125 as a mask, and so need no additional mask. The N+ implant is at a much higher dosage than the P+ and P-body implants and will dominate in the regions where it is implanted. In the termination area FIG. 3D-1 source implant is blocked by the third mask therefore only P-body implant and P+ implant are carried out using the existing field oxide and the gate poly 125 as implant mask to form floating guard rings 130' and guard ring contacts 140'. In FIG. 3E, a low temperature oxide (LTO) deposition is carried out to form an oxide layer 128 followed by applying a fourth mask (not shown) to open a contact opening through the oxide layer 128, and then etching into the silicon to form contact trench 142, then performing a shallow P− implant to form the shallow P− region 145. While the field oxide 115 in active area is removed during contact hole opening process field oxides 115' in termination area of FIG. 3E-1 remain while opening the contact holes through oxide layer 128' and thin oxide layer 120' as shown. The contact holes are further etched to form termination trenches 142'. In FIG. 3F, a top metal layer 150 is formed and patterned as a source metal layer by applying a fifth mask (not shown). A sixth mask (not shown) may be applied optionally to form and pattern a passivation layer (not shown) and a seventh mask (not shown) to form and pattern a polyimide layer (not shown) over the top surface of the device. A back side metallization process is then carried out (also in FIG. 3F) to form the drain electrode 160 on the back side of the substrate 105. In termination area metal layer is also patterned into metal conductors 150' to electrically connect polysilicon field plates 125' to floating guard rings 130' therefore forming a plurality of field plates 125'. Field plates 125' and floating guard rings 130' form the termination of device in FIG. 3F-1 to sustain high voltage in the edge area. As shown in the above process, the first mask provides both oxides in active area to block body implantation for Schottky formation and in termination area for field plate structure termination therefore a dedicated mask for Schottky formation is not necessary.

Figure 4:
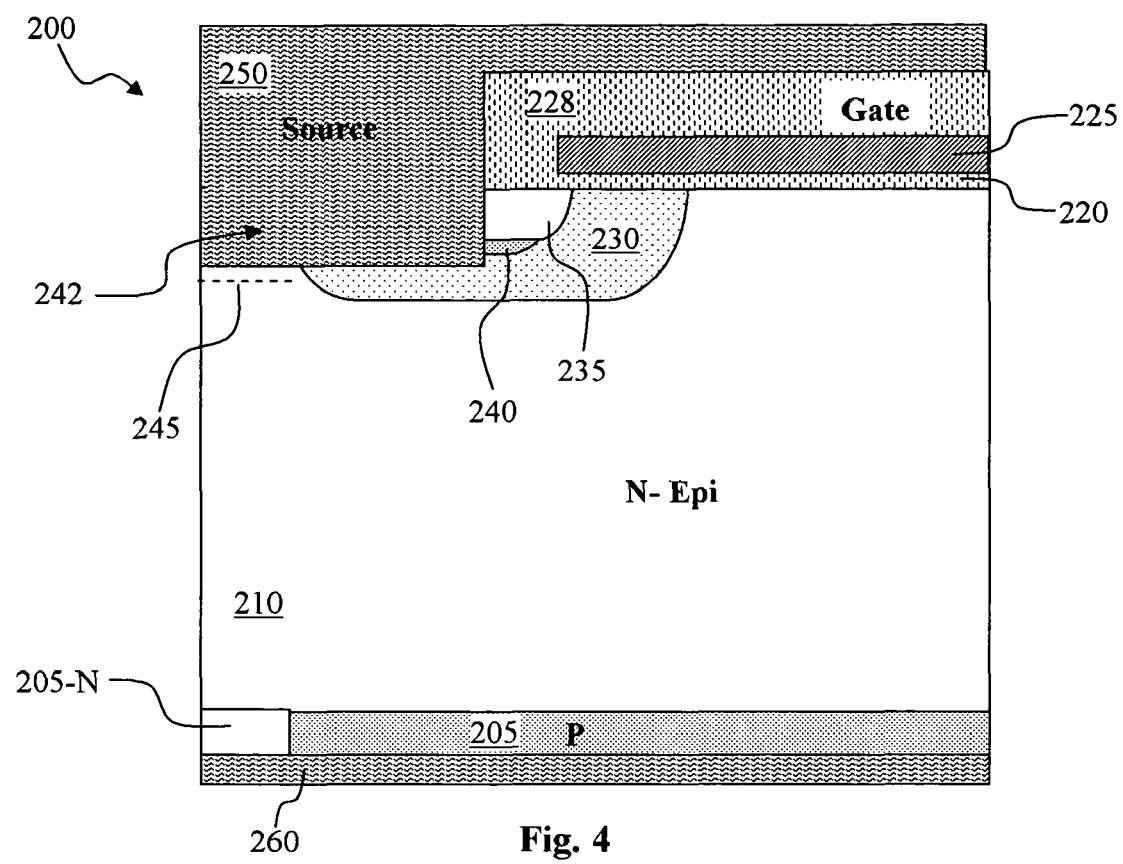
FIG. 4 is a cross sectional view of an insulated gate bipolar transistor (IGBT) device with an integrated Schottky diode of this invention.

FIG. 4 shows a cross-sectional view of an insulated gate bipolar transistor (IGBT) 200 of this invention. The IGBT 200 is formed in a semiconductor substrate 205 that has a first conductivity type, e.g., a P type substrate 205. An epitaxial layer 210 of a second conductivity type, e.g., an N− epitaxial (epi) layer 210, is supported on top of the P type substrate 205. The IGBT 200 is a vertical IGBT device with a collector electrode 260 disposed on a bottom surface of the substrate and an emitter electrode 250 disposed on a top surface and in a contact trench 242. A gate 225 is supported on top of a gate insulation layer 220. An N+ emitter/source region 235 is formed next to the emitter electrode 250 encompassed in a P-body region 230 extended below the emitter N-region 235 to a region underneath the gate insulation layer 220. The IGBT device 200 further includes a P+ doped region 240 within the P-body region 230 immediately next to the emitter N− region 235. When a gate voltage exceeding a threshold voltage is applied, the internal PNP bipolar transistor is turned on. An electrical current is conducted from the emitter region 235 through the P body region (in an n-channel) into the N− epi region 210, which induces a the PNP bipolar transistor to turn on thus producing a current from the P+ doped region 240 and the P body region 230 to the drift region as part of the N-epitaxial layer 110 to the substrate 205 and then to the collector electrode 260. The IGBT device 200 may be further integrated with an internal Schottky diode by applying a Schottky metal 250 as the emitter metal covering the top surface over and next to the N+ emitter region 235, the P+ region 240 and the P-body region 230. The Schottky metal 250 is in direct contact with the epitaxial layer 210 and the emitter region 235. An ultra shallow P implantation layer 245 is formed immediately underneath the Schottky metal 250 to reduce a leakage current. An N+ doped region 205-N is formed in a portion of the P+ substrate layer 205. The N+ doped region 205-N connects the collector electrode 260 to the N-Epi and allows the integrated Schottky diode to be connected between emitter electrode 250 and collector electrode 260.

The processing steps for manufacturing the IGBT device are the same as that described in FIGS. 3A to 3F, except that the starting material is a P substrate 205 supporting an N-epi 210, rather than N+ substrate 105 supporting an N-epi 110, and also a N+ implant is performed before back metallization to form the N+ doped region 205-N. An alternate process may begin with an N– substrate without an epitaxial layer. Before the backside metal process as shown in FIG. 3F and after a backside grinding is performed, a P+ blanket implanted at the backside, and a N+ masked implant (not shown) is followed to form the N+ substrate region 205-N. The IGBT device 200 integrated with a Schottky diode of this invention may also include the termination structure shown in FIG. 2-1 therefore no additional mask is required for the formation of integrated Schottky.

Figure 5A:
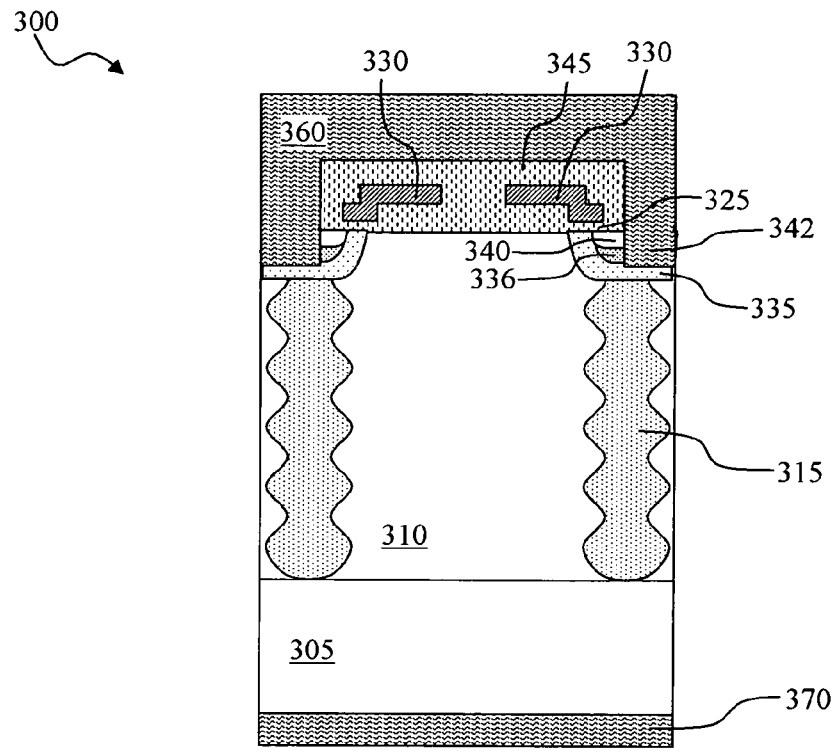
FIGS. 5A and 5B are cross sectional views of two super-junction semiconductor power devices of this invention.
Figure 5B:
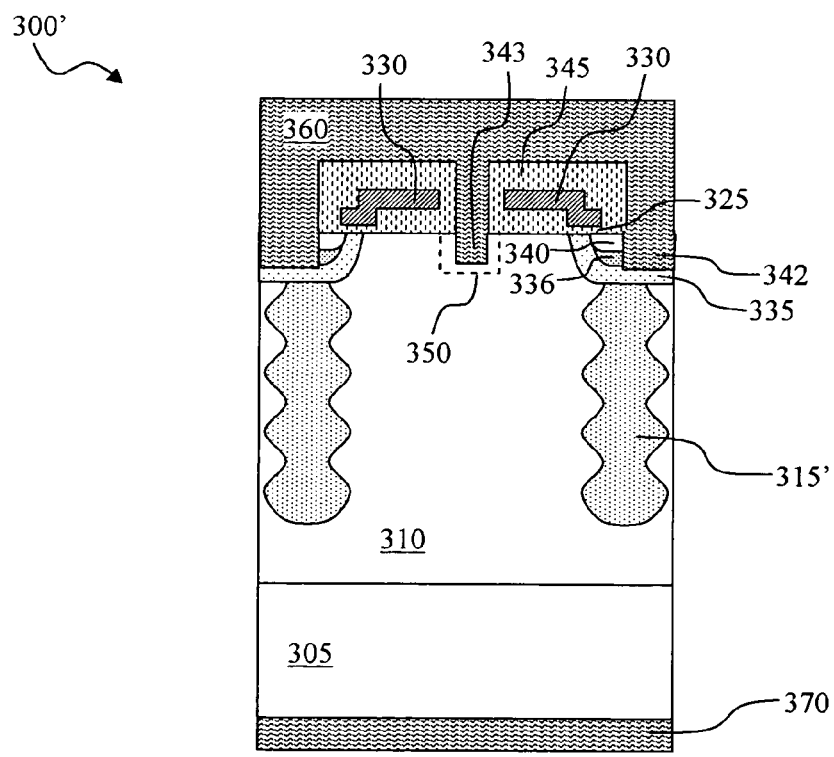

FIG. 5A shows a cross sectional view of a super-junction semiconductor power device 300. The super-junction device 200 is supported on an N+ silicon substrate 305 with an epitaxial layer 310 with P-doped vertical columns 315 in the epitaxial layer formed through multiple epitaxial layer growth and implantation processes as described below. A planar gate 330 is formed on top of a gate oxide layer 325. A P-body region 335 is formed in the epitaxial layer below the gate oxide layer 325 encompassing an N+ source region 340. An additional P+ body contact region 336 is formed within the P-body region 335. The P-body regions 335 are formed over the P-dopant columns 315 as well as a P+ body contact region 336 within the P-body regions 335 immediately below the source region 340. A source metal 360 covering the top surface and contact trench 342 with direct contact to the source region 340 and the P+ body contact region 336. A drain metal 370 to function as a drain electrode is formed on the back side of the semiconductor substrate 305 thus forming a vertical super-junction power device. The super-junction device may optionally be integrated with an internal Schottky diode by etching a Schottky trench 343 between the gates 330 and applying a Schottky metal 360 as the source metal covering the source region 340, the P+ region 336 and a Schottky contact P-dopant implant 350. The ultra shallow P implantation 350 is formed immediately underneath the Schottky metal 360 between the gates 330 to reduce a leakage current. The super-junction semiconductor power device 300 of this invention may also include the termination structure shown in FIG. 2-1 therefore no additional mask is required. The optional Schottky embodiment is shown in FIG. 5B FIG. 5B is a cross sectional view of another super-junction semiconductor power device 300' that has a similar structural features of FIG. 5A. The only difference are that the P-doped columns 315' extend to a depth in the epitaxial layer 310 at a distance above the bottom the epitaxial layer 310 interfacing with the bottom substrate N+ layer 305, whereas in the power device 300 of FIG. 5A, the P-doped columns 315 extend all the way to the bottom of the epitaxial layer 310, and also that FIG. 5B has the optional Schottky structure as described above. The super-junction semiconductor power device 300' integrated with a Schottky diode of this invention may also include the termination structure shown in FIG. 2-1 therefore no additional mask is required for the formation of integrated Schottky.

Figure 6A:
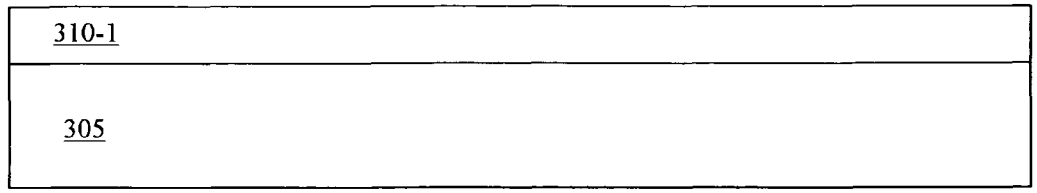
FIGS. 6A to 6I are serial cross sectional views for describing the manufacturing processes to fabricate a super-junction semiconductor power device of FIG. 5A.
Figure 6B:
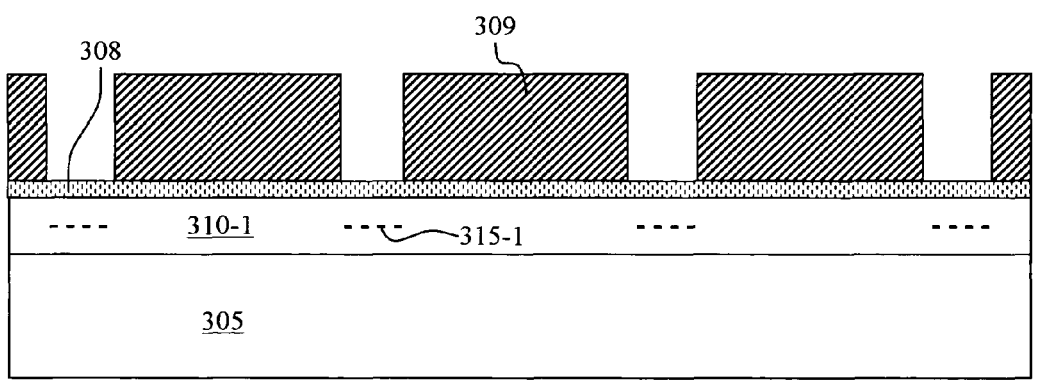
Figure 6C:
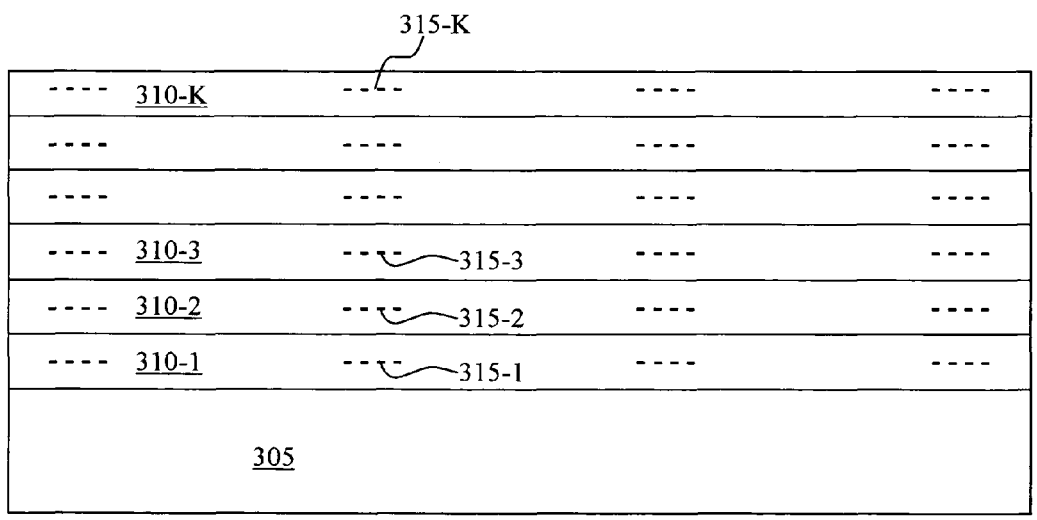
Figures 1, 6D:
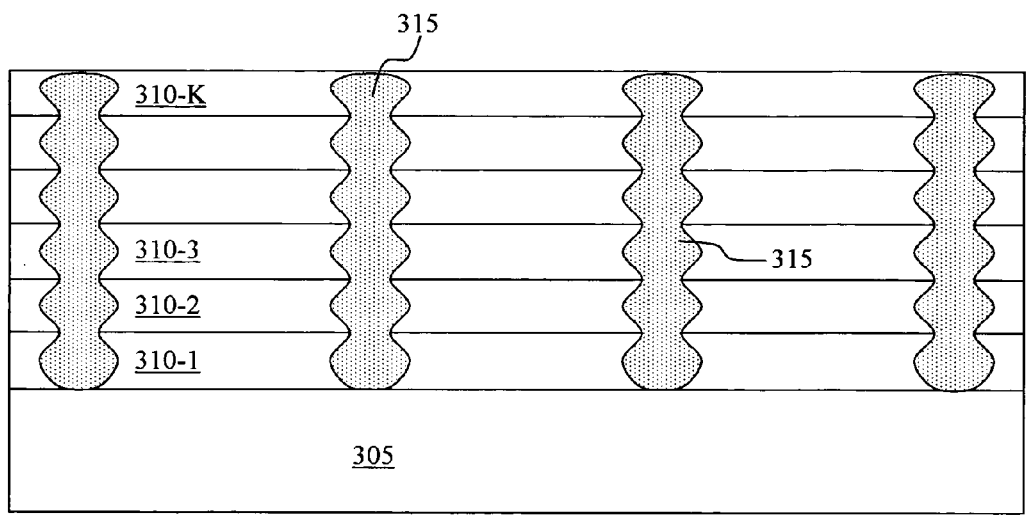
Figures 2, 6D:
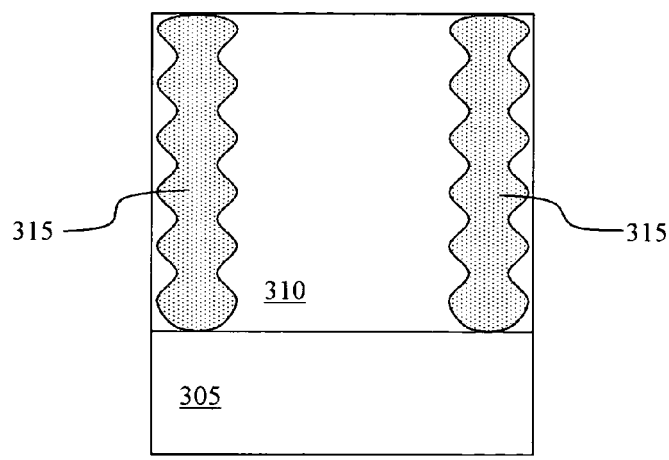

FIGS. 6A to 6J are a series of cross sectional views for illustrating the processing steps for manufacturing a super-junction semiconductor power device to reduce the Qrr as that shown in FIG. 5A. In FIG. 6A, the process starts with growing a first N– epitaxial layer 310-1 on an N+ substrate 305. In FIG. 6B, a mask (not shown) is applied to form the align-mark followed by growing a pad oxide layer 308. Then a mask 309 is applied to etch the oxide and carry out a boron implant at 200 KeV to form the P-regions 315-1 in the first epitaxial layer 310-1. The mask 309 is removed followed by an anneal process at 900° Celsius for 30 minutes to repair the implantation damages. The oxide pad 308 is removed followed by growing a second epitaxial layer 310-2 to repeat the above processing steps to form the second set of P-regions 315-2 in the second epitaxial layer 310-2. The same steps are repeated to form multiple epitaxial layers 310-1 to 310-K implanted with 315-1 to 315-K in each epitaxial layer, as shown in FIG. 6C. In FIG. 6D, an anneal process is carried out at 1150° Celsius for 400-600 minutes to diffuse the boron implanted regions to form multiple P-doped columns 315.

In FIG. 6D-1, an anneal process is carried out at 1150° Celsius for 400-600 minutes to diffuse the boron implanted regions to form multiple P-doped columns 315. In order to make P-doped columns that do not extend fully to the N+ substrate 305, as shown in FIG. 5B, the first N– epitaxial layer 310-1 would not receive the boron implantation 315-1 before growing second N– epitaxial layer 310-2. FIG. 6D-2 shows a subsection of the figure from FIG. 6D-1, from which the remainder of the steps of this process is demonstrated. For simplicity, in these steps, the multiple N– epitaxial layers 310-1 to 310-K are illustrated as a single continuous N– epitaxial layer 310.

Figure 6E:
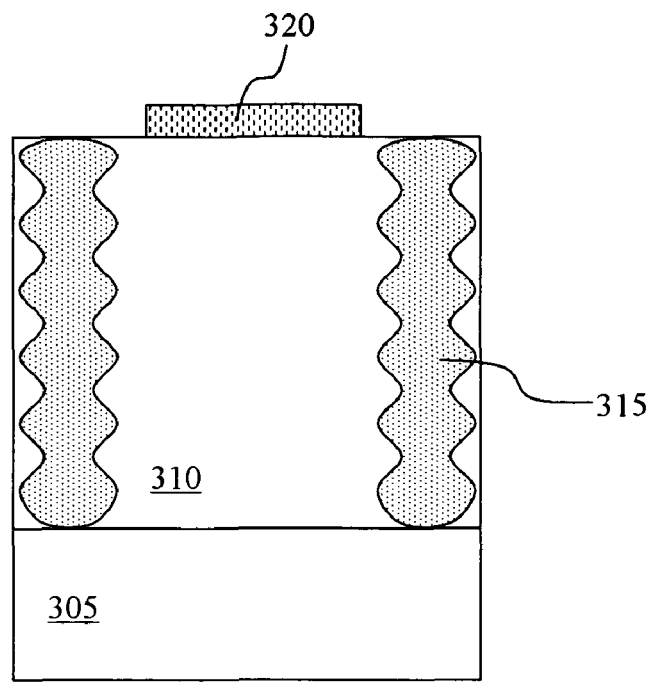
Figure 6F:
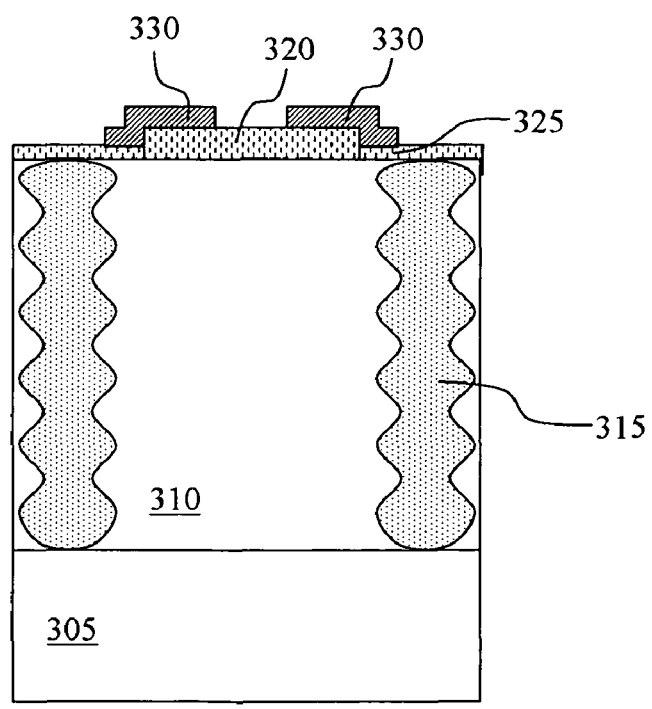
Figure 6G:
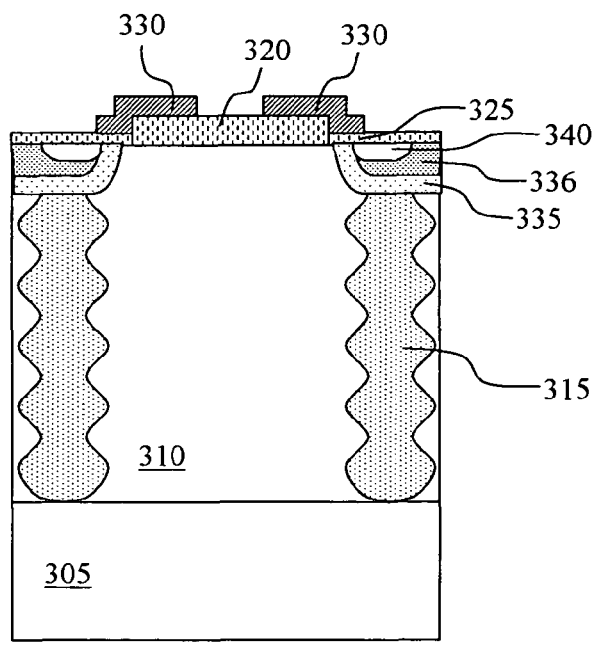
Figure 6H:
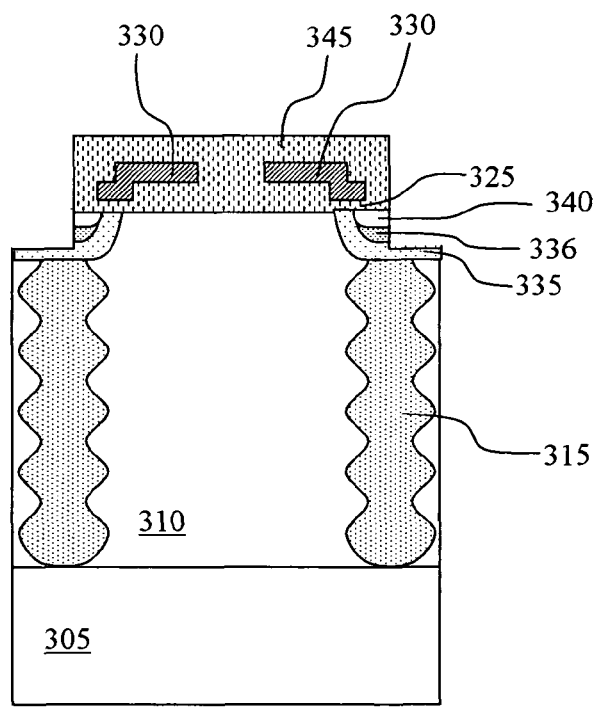
Figure 6I:
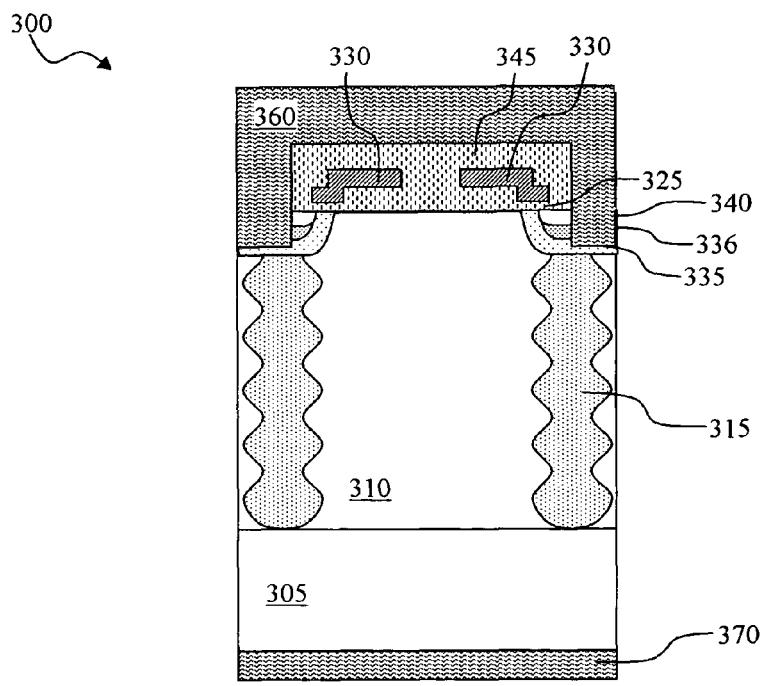

In FIG. 6E, a field oxide layer 320 is grown and etched by applying a first mask (not shown). In FIG. 6F, a gate oxide layer 325 is grown followed by depositing a polysilicon layer 330 on top of the gate oxide layer 325 and field oxide 320 and then patterning the polysilicon layer into the gate 330 by applying a second mask (not specifically shown). In FIG. 6G, P dopant implants are carried out to form the P+ body regions 336 and P-body regions 335. A source mask as a third mask is applied to carry out an N+ source implant out to form the source region 340. In FIG. 6H, a BPSG insulation layer deposition is carried out followed by applying a fourth mask (not shown) to carry out a contact opening process to form the insulation layer 345 with contact openings followed by etching the silicon further to form contact trenches 342. Optionally, a opening may also be etched between the polysilicon gates 330 followed by performing a Schottky implant to form the P-dopant Schottky contact regions 350 between the gates 330 to form a structure like that shown in FIG. 5B. In FIG. 6I, a source metal layer 350 which may also function as a source metal is formed and patterned on the top surface using a fifth mask, and a backside metal 360 is formed on the bottom surface to function as a drain electrode. Termination structure as shown in FIG. 2-1 is formed at the same process as illustrated in FIGS. 3A-1 to 3F-1.

Figure 7A:
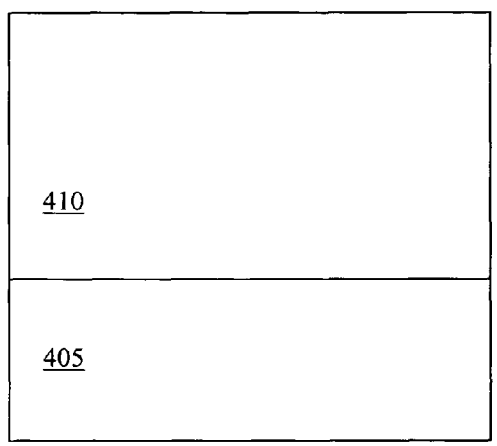
FIGS. 7A to 7E are serial cross sectional views for describing the manufacturing processes to fabricate another super-junction semiconductor power device of this invention.
Figure 7B:
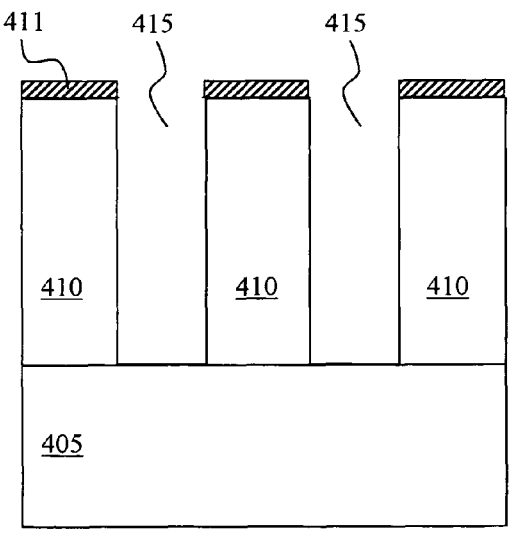
Figure 7C:
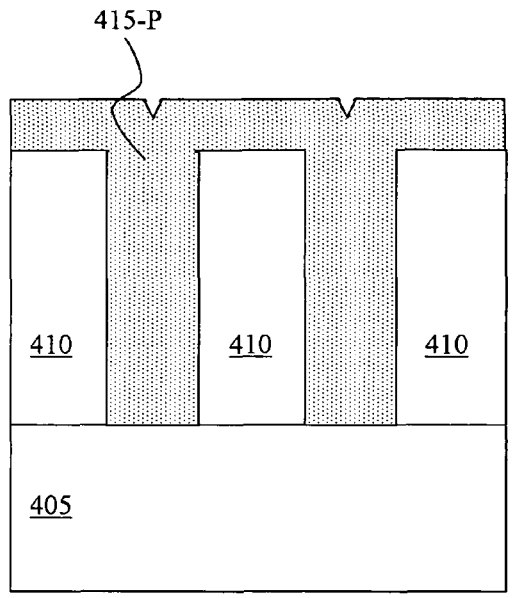
Figure 7D:
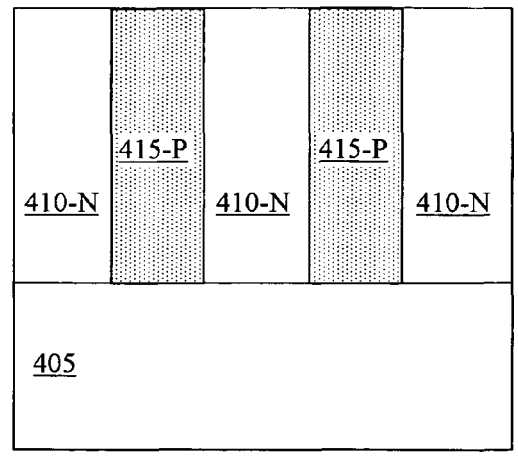

FIGS. 7A to 7E are a series of cross sectional views for illustrating an alternate set of processing steps for manufacturing a super-junction semiconductor power device. These steps show an alternate way of forming the P-columns 315. In FIG. 7A, the process starts with growing an N– epitaxial layer 410 on an N+ substrate 405. In FIG. 7B, a mask 411 is applied to open a plurality of deep trenches 415 in the epitaxial layer 410. In FIG. 7C, the deep trenches are filled with P-doped material 415-P, e.g., by epitaxial growth, then in FIG. 7D, a planarization process, e.g. by applying a chemical-mechanical planarization (CMP) process, is performed to remove the P-doped material from the top surface above the epitaxial layer 410. A plurality of P and N columns 415-P and 410-N are therefore formed in the epitaxial layer 410.

Figure 7E:
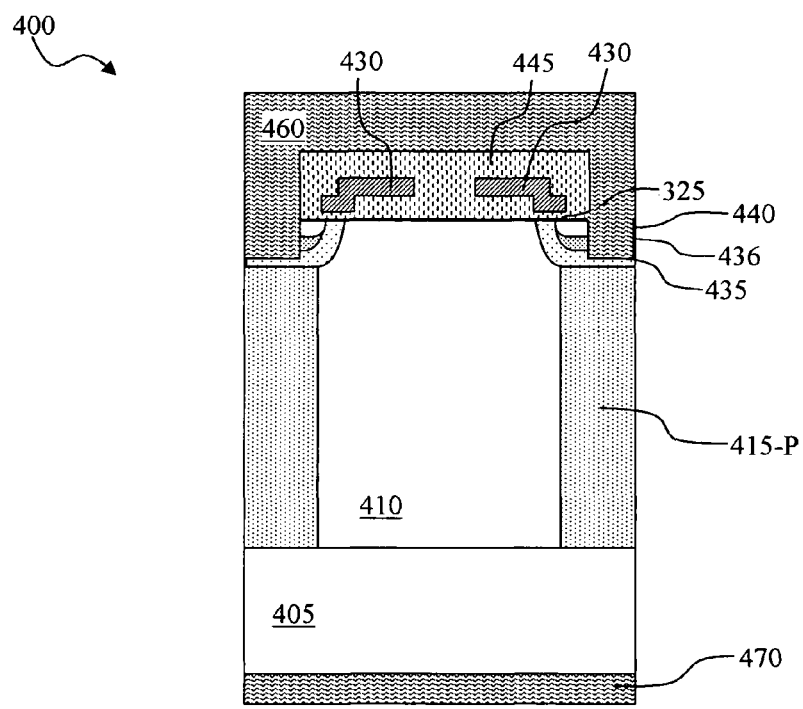

In FIG. 7E, the same processes as that described in FIGS. 6E to 6I are performed to form a super-junction semiconductor power device 400. The super-junction device 400 is supported on an N+ silicon substrate 405 with an N-epitaxial layer 410 with P-doped vertical columns 415-P in the epitaxial layer formed on top of the N+ substrate 405, e.g., an arsenide dopant substrate layer in an embodiment as shown. A planar gate 430 is formed on top of a gate oxide layer 425. A P-body region 435 is formed in the epitaxial layer below the gate oxide layer 425 encompassing an N+ source region 440. For a high voltage application, the P-body regions 435 is formed above the P-dopant columns 415-P. The P+ region 436 is formed within the P-body 435 immediately next to the source region 440. A source metal 460 covering the top surface with direct contact to the source region 440 and the P-body region 435. A drain metal 470 to function as a drain electrode is formed on the back side of the semiconductor substrate 405 thus forming a vertical super-junction power device. The super-junction device may also be integrated with an internal Schottky diode by applying a Schottky metal 460 as the source metal covering the top surface over the source region 440, the P+ region 436 and a Schottky contact P-dopant implant region 450, and by etching a contact opening between the gates 430. The ultra shallow P implantation layer 450 is formed underneath the Schottky metal 460 between the gates 430 to reduce a leakage current. Termination structure as shown in FIG. 2-1 is formed at the same process as illustrated in FIGS. 3A-1 to 3F-1.

Figure 8:
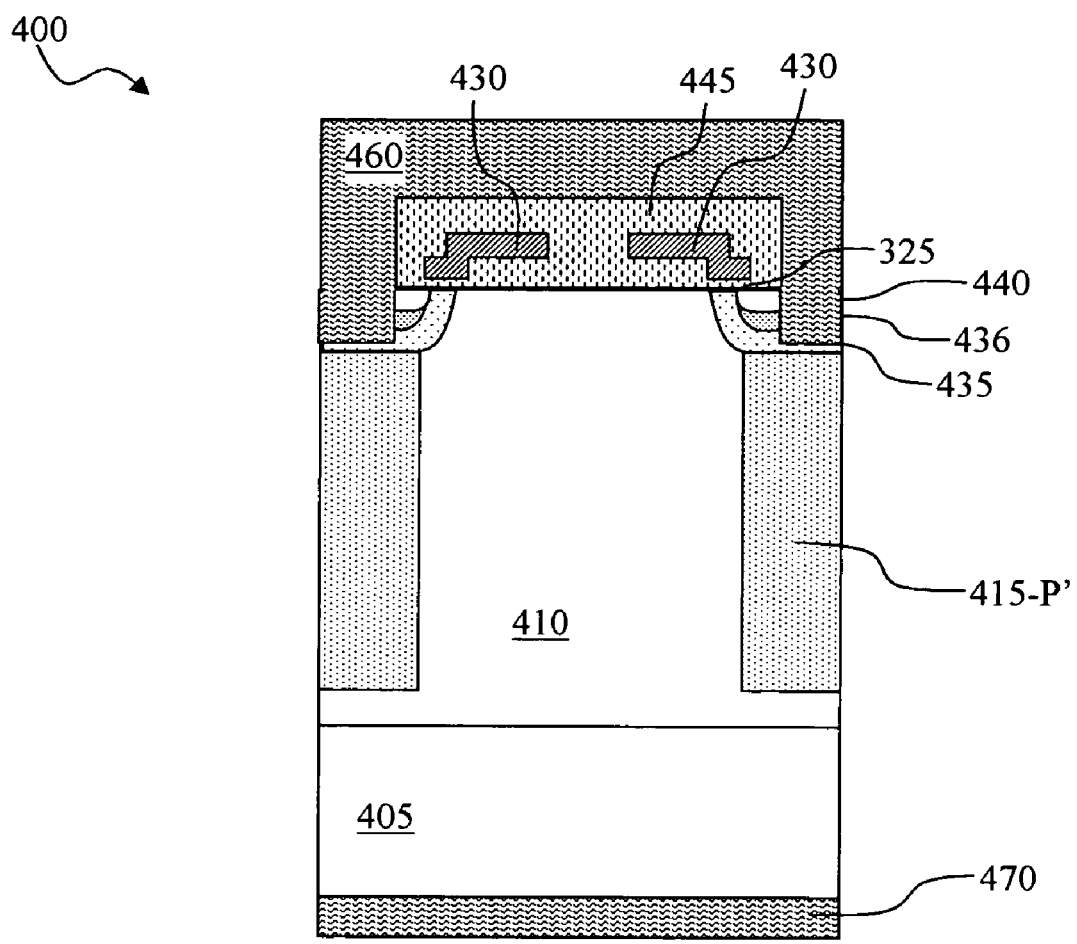
FIG. 8 is a cross sectional view for showing an alternate super-junction semiconductor power device of this invention.

FIG. 8 is a cross sectional view of another super-junction semiconductor power device 400' that has a similar structural features of FIG. 7E. The only difference is the P-doped columns 415-P' extend to a depth in the epitaxial layer 410 at a distance above the bottom the epitaxial layer 410 interfacing with the bottom substrate N+ layer 405. To form such a structure, the trenches 415 in the step shown in FIG. 7B would simply be etched shallower than the substrate.

Figure 9A:
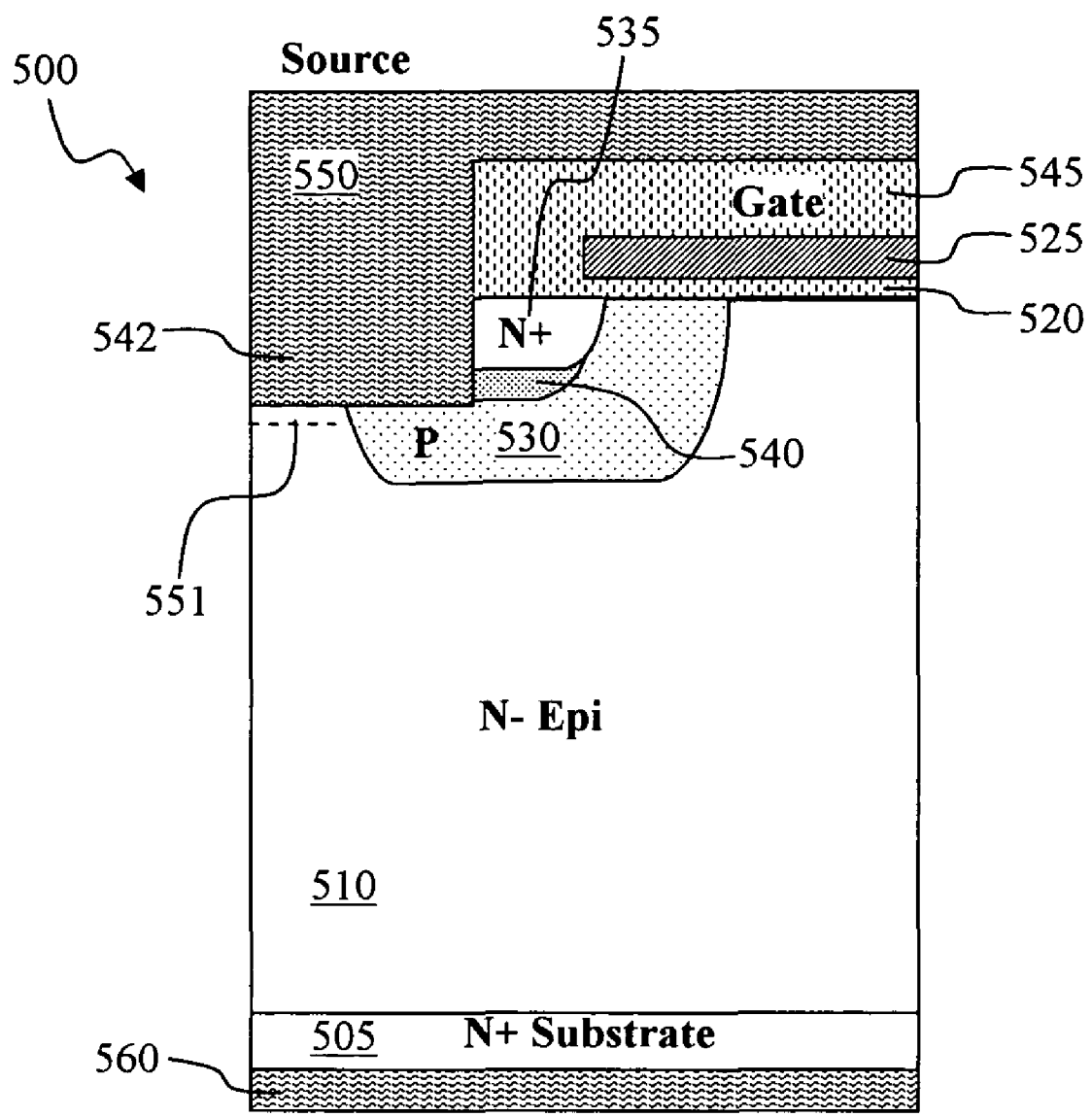
FIGS. 9A and 9B are cross sectional views of power semiconductor devices illustrating further aspects of this invention.

In addition to the embodiments above, the following strategy may also be implemented to reduce the Qrr in the body region while achieving a low on-resistance Rdson. FIG. 9A is a cross sectional view of a high voltage MOSFET (HV-MOSFET) semiconductor power device 500 integrated with a Schottky diode that has an improved diode reverse recovery by minimizing body charges of this invention while achieving a smaller cell size. The smaller cell size increases the cell density, which decreases the on resistance, Rdson. The HV MOSFET device 500 is supported on an N+ semiconductor substrate 505 with an epitaxial layer 510 formed on top of the N+ substrate 505. A planar gate 525 is formed on top of a gate oxide layer 520. A P-body region 530 is formed in the epitaxial layer below the gate oxide layer 520 encompassing an N+ source region 535. The MOSFET device 500 further includes a P+ doped region 540 within the P-body region 530 immediately below the source region 535. A BPSG layer 545 covers the gate 525, and has contact openings in it. A source metal 550 covers the top surface and the BPSG 545 and fills a contact trench 542. The contact trenches 542 extend into the silicon by removing a portion of the source region 535 and P+ dopant region 540. The contact trenches further extend through an upper portion of the body region 530 thus removing a top portion of the body region 530. The source metal filling in the contact trenches 542 is in direct lateral contact to the source region 535 and the P+ body contact region 540. A drain metal 560 functioning as a drain electrode is formed on the back side of the semiconductor substrate 505 thus forming a vertical MOSFET power device.

The MOSFET device may optionally be integrated with a Schottky diode by applying a Schottky metal as the source metal 550 covering the N+ source region 535, the P+ body contact region 540 and the P-body region 530 and performing a shallow P-Schottky implant 551 in the exposed parts of the N-Epi layer 510. Furthermore, since a portion of body is removed and filled with the source metal 550 in the contact trenches, the injection charges from the body regions are reduced and a diode reverse recovery of the HVMOSFET is improved. To further reduce the injection charges from the P− body region 530, the doping concentration of P− body region 530 may be reduced. Normally, this reduction in doping concentration of the P-body region 530 would alter (reduce) the threshold voltage, Vt, of the gate, but this can be countered by increasing the doping concentration of P+ region 540. The use of a trench contact helps reduce the cell pitch. Also not much room is needed for a Schottky diode (if a Schottky diode is even used) because the reductions in P body injection charges already improve Qrr, Trr, and S. The cell pitch of this embodiment is greatly reduced, which allows a lower Rdson, while still achieving the goals of improving the diode reverse recovery.

Figure 9B:
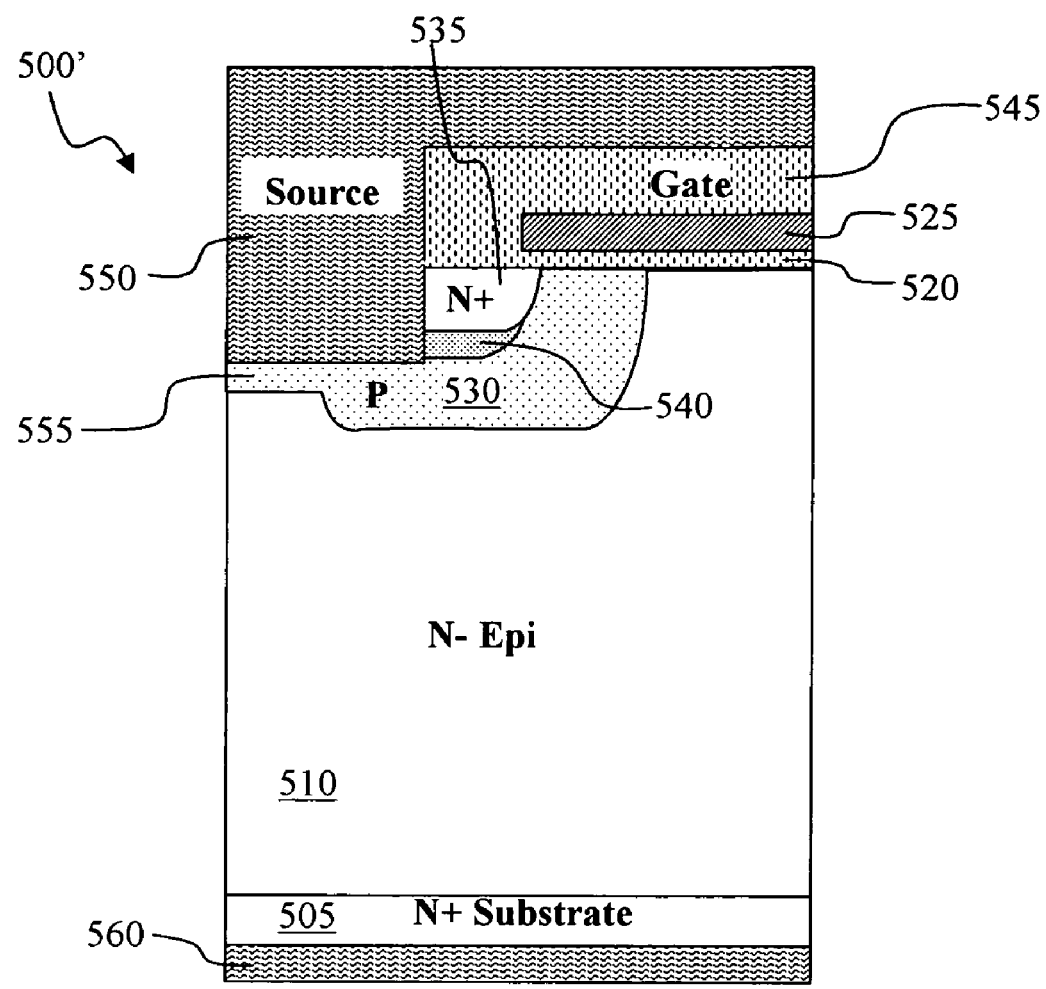

FIG. 9B is a cross sectional view of an alternate embodiment of a HVMOSFET integrated with a diode similar to the HVMOSFET shown in FIG. 9A. The only difference is the HVMOSFET device shown in FIG. 9B has a high energy, low dosage boron implant region 555 formed immediately underneath the source metal 550 to improve the body curvature to be not as sharp, which helps keep the breakdown voltage high. This changes the Schottky diode under the source metal 550 into a normal P-N diode. However, the reduction in body region area and dosage improves the reverse recovery characteristics such as Qrr, Trr and S (softness) without the use of a Schottky diode.

Figure 10A:
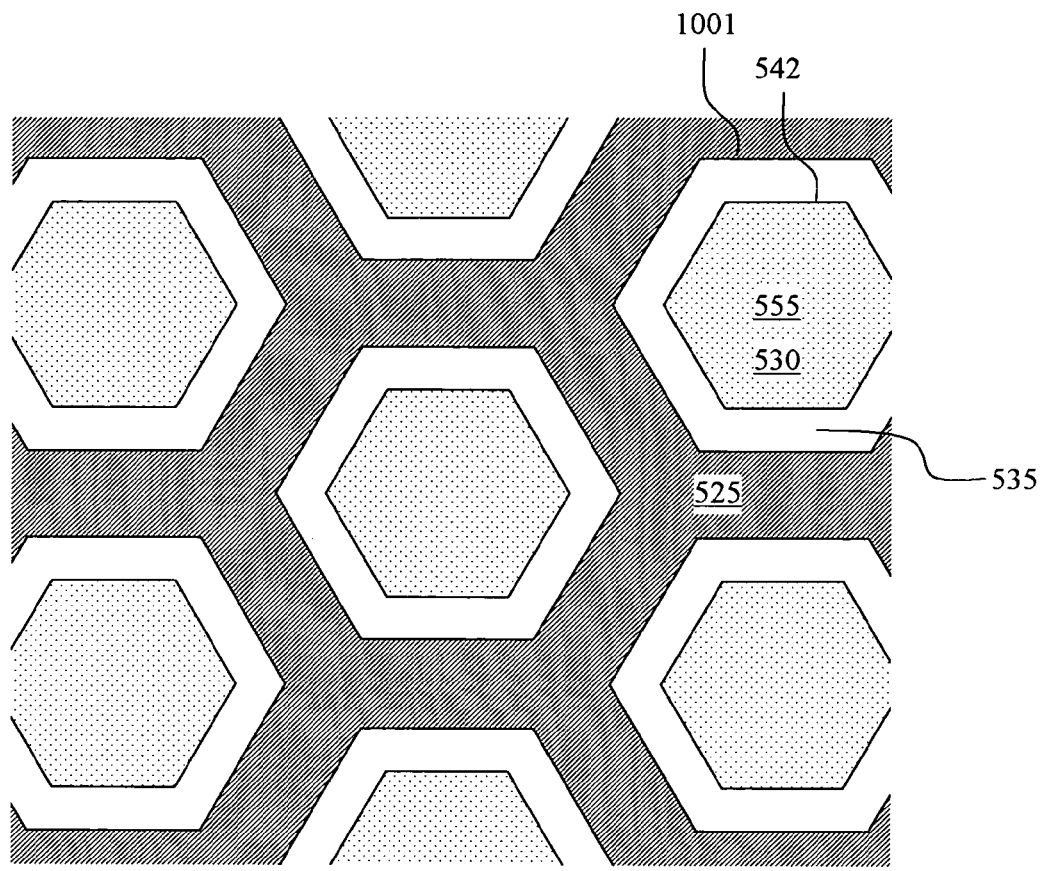
FIGS. 10A and 10B are top views showing possible layouts for semiconductor power devices of this invention.
Figure 10B:
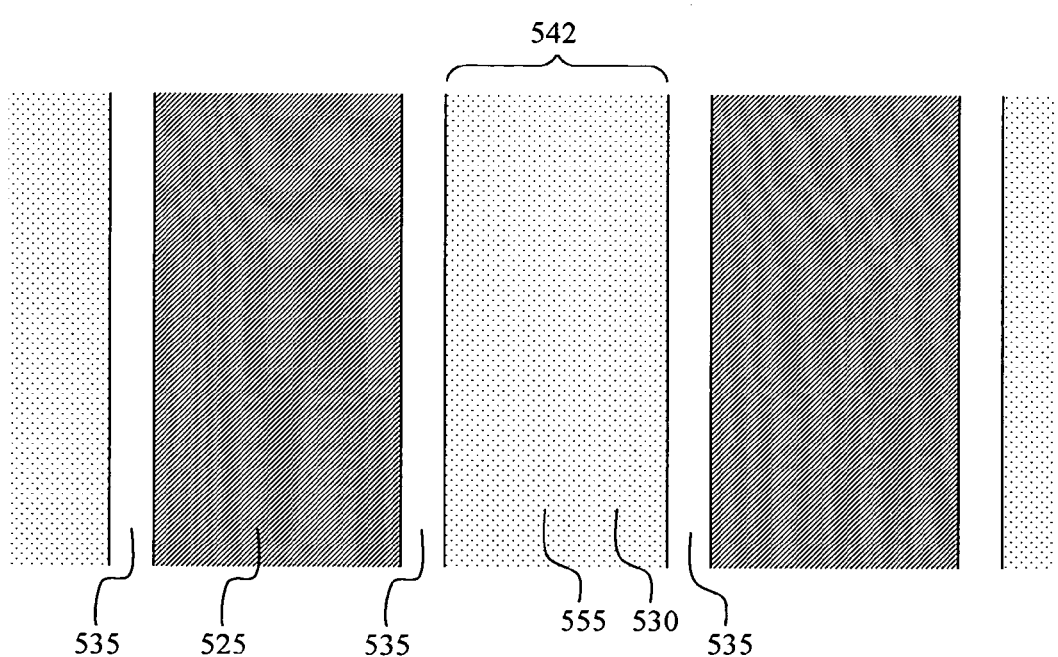

FIGS. 10A and 10B are top views showing possible layouts for the embodiments above. FIG. 10A shows a closed cell layout, and FIG. 10B shows a stripe cell layout. The semiconductor device 500' of FIG. 9B is used as an example for the layouts in FIGS. 10A and 10B, with the source metal 550, and BPSG 545 removed for clarity. As shown in FIG. 10A, the gate 525 forms a "honeycomb" pattern, with hexagonal openings 1001. The N+ source regions 535 are located adjacent to the edges of the gate 525 and form a ring within the hexagonal opening 1001. The inner edge of the ring formed by the source regions 535 is the edge of the contact trench 542. The P-type regions 555 and 530 are exposed at the bottom of the contact trench 542.

FIG. 10B shows a simpler stripe layout. The gate 525 runs in a straight stripe, as does the source region adjacent to it 525. Between the source regions 525, the contact trenches 542 follow alongside in a straight stripe. At the bottom of the trench 542, the P-type regions 555, 530 are exposed. The closed cell layout of FIG. 10A may further reduce the amount of P-body regions 530, to achieve even better improvements in Qrr, Trr, and S.

Although the present invention has been described in terms of the presently preferred embodiment, it is to be understood that such disclosure is not to be interpreted as limiting. For example, gate dielectric can be a more general term for gate oxide, and a hard mask such as nitride or deposited oxide may be used instead of field oxide. As another example, though n-channel devices have been illustrated here, the same principles can be applied to p-channel devices simply by reversing the conductivity types of the various layers and regions. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A method for manufacturing a semiconductor power device in a semiconductor substrate comprises an active cell area and a termination area comprising:

growing and patterning a field oxide layer in said termination area and also in said active cell area on a top surface of said semiconductor substrate using a first mask;

forming a gate oxide layer on said top surface of said semiconductor substrate;

depositing and patterning with a second mask a polysilicon layer on said gate oxide at a gap distance away from said field oxide layer, wherein said polysilicon layer acts as planar gates in the active area;

performing a blank body dopant implant to form body dopant regions in said semiconductor substrate substantially aligned with said gap area followed by diffusing said body dopant regions into body regions in said semiconductor substrate;

forming body contact regions encompassed in and having a higher dopant concentration than said body regions, wherein said field oxide layer patterned in the termination area and the active cell area reduces P-body charges in the semiconductor power device in forming the body and body contact regions;

applying a source mask as the third mask to implant source regions having a conductivity opposite to said body regions with said source regions encompassed in said body regions and located above said high concentration body contact regions;

depositing an insulation layer on top of said semiconductor power device and applying a contact mask as the fourth mask to open contact openings and remove said field oxide, and etching into the semiconductor substrate to form contact trenches, wherein said contact trenches further reduce the amount of P-body charges in the device; and depositing a metal layer filling in said contact trenches to contact said body regions and said source regions, and patterning said metal layer with a fifth mask.

2. The method of claim 1 wherein:

said step of depositing a metal layer filling in said contact trenches further comprises depositing a Schottky metal layer to form integrated Schottky diodes.

3. The method of claim 2 further comprising:

forming shallow body-type regions adjacent to said body regions immediately below said contact trenches to adjust the Schottky barrier height.

4. The method of claim 1 wherein:

said step of performing a blank body dopant implant to form body regions further comprises performing a blank body dopant implant by implanting a first dopant body-dopant concentration with a reduced-body dopant concentration, and compensating by forming said body contact regions with an increased concentration to reduce body-dopant charges while maintaining a gate threshold voltage.

5. The method of claim 1 wherein:

said step of manufacturing said semiconductor power device further comprises a step of manufacturing a MOSFET power device.

6. The method of claim 1 wherein:

said step of manufacturing said semiconductor power device further comprises a step of manufacturing an IGBT power device.

7. The method of claim 6 wherein:

said applying a contact mask as the fourth mask to open contact openings further comprises forming an opening between polysilicon gates to form a Schottky diode trench.

8. The method of claim 1 wherein:

said step of manufacturing said semiconductor power device further comprises a step of manufacturing a superjunction power device.

9. The method of claim 8 further comprising prior to said step of growing and patterning a field oxide layer:

forming charge balanced alternating p-type and n-type columns in said semiconductor substrate.

10. The method of claim 1 further comprising a step of:

forming a body-type dopant region adjacent to the body region and below said contact trench to reduce the curvature of the body region.

11. The method of claim 1 wherein:

said step of depositing and patterning with a second mask a polysilicon layer further comprises depositing and patterning with a second mask a polysilicon layer in the termination area, wherein the polysilicon layer formed in the termination area act as field plates.

12. The method of claim 1 further comprising a step of:

forming a metal layer on the bottom of the semiconductor device to form a bottom electrode.

* * * * *